(12) United States Patent
Norman et al.

(10) Patent No.: US 11,448,603 B1
(45) Date of Patent: Sep. 20, 2022

(54) METHODS AND APPARATUSES FOR MICROSCOPY AND SPECTROSCOPY IN SEMICONDUCTOR SYSTEMS

(71) Applicant: Axiomatique Technologies, Inc., Fremont, CA (US)

(72) Inventors: Trevor A. Norman, Fremont, CA (US); Robert Mamazza, Palm Harbor, FL (US); Francisco Xavier Machuca, Oakland, CA (US)

( * ) Notice: Subject to any disclaimer, the term of this patent is extended or adjusted under 35 U.S.C. 154(b) by 0 days.

(21) Appl. No.: 17/465,562

(22) Filed: Sep. 2, 2021

(51) Int. Cl.
  *G01N 21/95* (2006.01)
  *G01N 21/25* (2006.01)
(52) U.S. Cl.
  CPC ......... *G01N 21/9505* (2013.01); *G01N 21/25* (2013.01)
(58) Field of Classification Search
  CPC ............................ G01N 21/9505; G01N 21/25
  See application file for complete search history.

(56) References Cited

U.S. PATENT DOCUMENTS

| 2014/0268105 A1* | 9/2014 | Bills | G01N 21/453 |
| | | | 356/51 |
| 2017/0103868 A1* | 4/2017 | Novak | H01J 37/226 |

FOREIGN PATENT DOCUMENTS

JP  2007040909 A * 2/2007 .......... G01N 21/956

* cited by examiner

*Primary Examiner* — Jamil Ahmed

(57) ABSTRACT

A defect detection and imaging system is presented for performing microscopy and/or spectroscopy on a device under test. The defect detection system comprises a controller for toggling the state of a light source, which may allow for fast simultaneous high-speed inspection and high-resolution review imaging of the device under test by the same system and simultaneously deliver inspection, computer generated reconstructions or tomography, and defect review on sub second time-scales. The defect detection system further comprises a converter for converting X-ray images of the device under test into photoelectron contrast images to achieve nanometer scale measurement resolution in non-destructive and real-time fashion, to complement or replace destructive TEM. These photoelectron contrast images may be received by a detector to output an electronic format map or 3D/4D image that indicates one or more features of the device under test.

20 Claims, 5 Drawing Sheets

METHODS AND APPARATUSES FOR MICROSCOPY AND SPECTROSCOPY IN SEMICONDUCTOR SYSTEMS

TECHNICAL FIELD

This application relates generally to the technical field of defect detection or inspection, gauge metrology, and various imaging reconstruction techniques such as laminography and computer generated tomography, more particularly, to defect detection and metrology within semiconductor systems, process flows, and factories.

BACKGROUND OF INVENTION

Moore (of Moore's Law), with respect to cost, spoke of "minimum component costs" and stated, "cost per component is nearly inversely proportional to the number components." Today, to conform to the goal of achieving transistor density doubling every two years (Moore's Law), the production of high performance and highly reliable circuits has become increasingly difficult. For example, between the years 2008-2012, 22 nanometer ($1 \times 10^{-9}$ meter) (nm)-based memory devices and central processing units (CPUs) were created for the first time in non-compliance with Moore's Law. Key reasons for this failure were the additional cost for the added complexity of 22 nm-based devices and lack of quality and yield controls for 22 nm products. These quality and yield controls were no longer determined in the traditional well-controlled front-end of a semiconductor manufacturing line. Known front-end defect control strategies include layer by layer inspection without deep penetration of light, whose capability to inspect an integrated circuit (IC) or IC component cannot achieve full penetration necessary for this art.

In systems prior to the advent of advanced semiconductor packaging, front-end testing such as bright field inspection and e-beam wafer inspection were enough to detect defects in the outer most planar layers of the IC or IC components with resolution sub 100 nm. This defect inspection led to satisfactory detectability because there was not a need to penetrate deeply into the IC package and maintain high resolution (near surface planar inspection and metrology). A bright/dark field inspection microscope or e-beam tool performs defect inspection or metrology during the design/development and yield ramp phases of the semiconductor fabrication process and inspects the topmost surface without penetration. During these production lifecycle phases, a bright/dark field inspection or e-beam microscope can be utilized to minimize defects and enhance production yield and decrease time to full ramp up into high volume production (HVM), mainly because devices prior to 2008 were largely planar ICs built layer by layer in additive/subtractive processes that exposed the top surface to measurement by e-beam or visible optical light of the bright field or dark field microscope. Subsequently, once the defects are minimized in the yield ramp phase, the use of the e-beam or bright/dark field inspection is reduced in order to speed up fabrication and throughput. Only in cases where the yield is disrupted, such as out of control excursion (OCAP), does the use of the e-beam or bright/dark field inspection return to 100% coverage inspection and is highly limited in its capability to detect to the last planar layer within the process flow. However, currently, the use of e-beam and bright/dark field inspection is primarily limited to front-end fabrication of transistors/memory (wafer foundry) and non-existent in the back-end factories such as the OSAT's (outsource assembly and test services), where components of an IC are assembled. The primary limitation with bright/dark field inspection and e-beam wafer inspection is the fact that it cannot penetrate deeply the semiconductor (e.g., IC or memory circuit) die, module, or overall assembled package in wafer, panel, strip, or singulated component format. This limitation is especially problematic with the introduction of advanced semiconductor packaging (ASP) which requires deeply penetrating light beyond the existing capability of bright/dark field inspection and e-beam wafer inspection/metrology. In ASP, active circuit elements are buried deep within the package substrate or even within a single chip, typically greater than 10 microns ($1 \times 10^{-6}$ meter) deep, and even could extend through a multitude of stacked and bonded chips or wafers in excess of 750 microns in depth. As can be seen, the depth of circuit elements within ASP makes the use of e-beam or bright/dark field inspection/metrology tremendously difficult.

ASP is a term used to refer to different technologies to assemble application processors and memory, with various packaging techniques for increasing the overall density of a final IC and integrating one or more semiconductor chips or IC's. Techniques, technologies for interconnection, process steps, and assembly work flows to achieve ASP include but are not limited to: wafer bumping, System on IC (SoIC), fan-out wafer level package or FOWLP (their trade names such as eWLB, FOcus, and InFO), Panel Level Packaging (PLP), fan-out panel level packaging (FOPLP), fineline redistribution lines or (RDL) on substrates without Si interposers (high density interconnect or HDI with imbedded bridges, or RDL on glass, other HDI printed circuit or wiring boards or PCB/PWB), Silicon via interposer, through Si-via or TSV stacked wafers, placing Chip/Chiplets on Wafer (CoW), Chip/Chiplets on Wafer on Substrates (CoWoS), Chips/Chiplets on Substrates using flip chip technology, embedded Chips/Chiplets in Substrate, and the like. An advantage of advanced semiconductor packaging is increased performance outside of transistor scaling and ultimately outside of the wafer front-end factory by less expensive assembly or stacking/interconnection techniques of chips, memory, and other supporting circuit elements, cheaply performed in the back-end factory, which results in an improvement in: overall density, bandwidth, latency, and signal speed/data rates, and an increase in I/O pin count (lowering resistance, impedance, and capacitance and associated delay times in signal propagation, and communication between elements).

Additionally, within a package (e.g., an IC package) the performance and density may be increased by removing traditional solder interconnections that join one or more of the circuit elements together, or making direct metal to metal electrical contact, known as using Direct Bonded Interconnects (DBI), hybrid bonding (HB), or vertical interconnect access (VIA) between components within the package. DBI may replace older solder bump technology for flip chip BGA packaging. Here in the back-end (i.e., the assembly of all the components of an IC), the variety of assembly implementation techniques impedes the use of front-end wafer inspection tools such as e-beam and optical (bright and dark field tools) because unlike in the front-end (i.e., where components such as transistors are made) there is no front-end like predictable layer by layer planar wafer whose defects under test exist within 3 microns of the topmost surface under illumination. Stated another way, due to the density of an IC, defect discovery and metrology (measurement gauges, i.e., distance, offsets, areas, perimeters, heights, spacings, etc.) in the back-end (when the components of the IC are being assembled or are assembled) requires deeper pentation than defect discovery and measurement in the front-end (when the various components of the IC are being manufactured one planar layer at a time).

In some advanced semiconductor package cases, the IC active element within a chip or chiplet or within stacked chips impedes the use of traditional e-beam or optical tools. Instead, due to their impenetrability, traditional e-beam and optical tools may only penetrate an IC package less than 3 microns from the package's surface. Such impenetrability prevents detection of defects within an IC package that is deeper than 3 microns from the package's surface. A solution is provided for a method and apparatus to detect and meter gauges of interest with both traditional defects and a new class of manufacturing defects in metal to metal contacts that are deeply recessed (e.g., greater than 3 microns) from any surface during assembly, and in addition to classic failure mode inspection (open/short, bridge, nonwet, cold joint, shift/offset, missing solder, bleeding solder, voids), new failure modes can be inspected such as breaks or cracks in Si, or other circuit elements are possible.

BRIEF SUMMARY

In one embodiment, a defect detection and metrology method, apparatus, and system (herein after "the system") is presented comprising a source controller that controls one or more cycles of a light emitting device. The cycle of the one or more cycles comprises an on state and an off state. During an on state, the light emitting device outputs a light beam capable of penetrating a device under test at least to a first depth. The light beam comprises a spatially coherent light wave. During an off state, the light emitting device is powered off. The system further includes a converter that, based at least in part on light waves that were incident on a device under test, generates a photoelectron contrast image indicating one or more properties of the device under test. The system further includes a detector that, based at least in part on the photoelectron contrast image, generates at least one electronic map. The detector further outputs the at least one electronic map.

In one embodiment, a cycle of the one or more cycles has a duration of less than 1 second. In one embodiment, during a first cycle of the one or more cycles, the light emitting device exposes a first portion of the device under test at a first magnification and during a second cycle of the one or more cycles, the light emitting device exposes the first portion of the device under test at a second magnification, wherein the first and second magnifications are different and the first cycle of the one or more cycles and the second cycle of the one or more cycles are both less than 1 second.

In one embodiment, the converter is a photoelectron converter. The photoelectron converter can be a multilayer device with one or more of the following properties: a first layer that has high absorption with high stopping power for X-rays and ultraviolet (uv) light. The first layer is also anisotropic in the absorption of X-rays or uv light, meaning the parallel direction to the optical axis is preferentially absorbing and has far greater absorption than absorption in direction transverse to the optical axis direction. The preferentially absorbed X-rays or uv light are converted directly to photoelectrons. The emitted photoelectrons are fed, via a vacuum, into an electron-optical system. The electron-optical system may include: acceleration, energy filtering, bending/guiding, and focusing using electromagnetic lenses. The electromagnetic lenses may be followed by micro or nano channel plate electron gain stages to boost the signal for subsequent imaging techniques. These imaging techniques may include, but are not limited to: conversion within a vacuum using a phosphor/fiber bundle vacuum window coupled to an external (to the vacuum window) CMOS/CCD camera.

In one embodiment the converter is a photocathode with columnar growth for the anisotropy of X-ray and uv light absorption containing cesium (Cs), rubidium (Rb), lead (Pb), bismuth (Bi), zinc (Zn), cadmium (Cd), tellurium (Te), tungsten (W), iodine (I), or any heavy atom and with a thickness in the range of 5 nm to 100 nm comprised of an electrically conductive layer with a thickness between 0.1 nanometer and 10 nanometers. In one embodiment, the detector comprises a phosphor screen and optical fiber bundle connected to a charged coupled device (CCD) camera or a scientific complementary metal-oxide semiconductor (sCMOS) camera or a complementary metal-oxide semiconductor (CMOS) camera downstream from the photocathode.

In one embodiment, the converter comprises a transferred high density material characterized by a high Z atomic number material (e.g., 40<Z) that is artificially anisotropic in the X-ray and uv light absorption, preferentially absorbing along the incident direction of light or the optical axis. The multilayer converter comprises a transferred high Z atomic number material in direct contact with a photocathode of zero barrier to vacuum. This high Z atomic number material comprises of, but is not limited, Bismuth Germanate (BGO), Cadmium Tungstate (CdW04), Europium doped Calcium fluoride CaF2 (Eu), cesium doped multi element ceramic (Gd,Lu)3(GaAl)5, O12(Ce) or GaGG(Ce), Lutetium Yttrium Silicate (LYSO), lutetium silicate (LSO), Sodium doped Cesium Iodide CsI(NA), Thallium doped Cesium Iodide CsI (Tl), Sodium Iodide (NaI), Thallium doped Sodium Iodide NaI(Tl), Cesium Bromide (CsBr), Thallium doped Cesium Bromide CsBr(Tl), amorphous Selenium alpha-Se, Yttrium Aluminum Garnet (YAG), Yttrium Aluminum Perovskite (YAP), and/or Zinc Tungstate (ZnWO4). The high Z atomic number material may be embodied in one or more organizations such as patterned solid film into small areas such as small pillars or islands, growth within small glass or metal fiber bundles, growth within nano or micro pores in glass or tungsten such as those commonly found in micro channel plates, or another organized array of holes. Whereas, the contacting photocathode material comprises of, but is not limited, members of the alkali halides (including but not limited to, Cesium Iodide (CsI) and Cesium Bromide (CsBr)), III-V semiconductors (including but not limited to gallium arsenide (GaAs), indium gallium nitride (In(1-x)Ga(x)N), aluminum gallium nitride (Al(1-x)Ga(x)N), indium phosphide (InP), and including any mole fraction where x can span any integer value between 0 to 1), II-VI semiconductors (including but not limited to Cd(1-x)Te(x), (Cd(1-x)Zn(x))(1-y)Te(y) or CZT, and including any mole fraction where x and y can span any integer value between 0 to 1), Diamond, and Boron Nitride, and including any negative electron affinity activation layer(s), including but not limited to, an alkali layer of cesium, and a halide layer of fluorine, with or without dipole layer including a low atomic element such as O, N, or H, all to lower the vacuum barrier to 0 eV at the emitting photocathode surface to generate a minimal transverse and longitudinal energy spread in the photoelectrons set only by the temperature (room temperature achieves 25 meV, Liquid Nitrogen temperature achieves 5 to 7 meV, Liquid Helium temperature achieves <5 meV).

In one embodiment the converter from X-rays or uv light to photoelectrons is held at low temperatures by liquid nitrogen LN2 (63-77K) to yield 5-7 meV (millielectronvolt) transverse and longitudinal energy spreads. The low temperatures may also be held by liquid Helium LHe (4K) to achieve <5 meV transverse and longitudinal energy spreads. This lowering of temperature will generate monochromatic electrons to remove chromatic aberrations in various electron microscopes (including but not limited to, Scanning Electron Microscope (SEM), Transmission Electron Microscope (TEM), Low Energy Electron Microscope (LEEM), and X-ray or uv light based Photoemission Electron Microscope (PEEM)) for highest resolution or resolving power electron imaging or highest accuracy energy analysis for accurate materials composition determination such as Electron Energy Loss Spectroscopy.

In one embodiment, the multilayer device is a transferred high Z atomic number material that is artificially anisotropic in the X-ray and uv light absorption, preferentially absorbing along the optical axis, through the chemical bonding anisotropy that creates an anisotropy to X-ray and optical absorption coefficient. This anisotropy in absorption channels X-ray absorption preferentially in a forward direction and not laterally, removing the need to artificially pattern the high Z atomic number material. For instance, but not limited to, the anisotropy can be achieved by the two-dimensional 2D alternating layers causing weaker chemical bonding between neighboring layers compared to the in-plane bonding in alkali halide perovskites.

In one embodiment, the converter is a photocathode comprised by an electrically conductive layer with a thickness between 0.1 nanometer and 10 nanometers. In one embodiment, the detector comprises a charged coupled device (CCD) camera or a scientific complementary metal-oxide semiconductor (sCMOS) camera or a complementary metal-oxide semiconductor (CMOS) camera.

In one embodiment, the photoelectron contrast image comprises one or more indications of attenuation or changes in phase coherence based at least in part on the light beam being incident on the device under test. In one embodiment, the light beam is an X-ray comprising of spatially coherent X-rays. In one embodiment, the light beam is an X-ray comprising of spatially coherent and temporally coherent X-rays. In one embodiment, the light beam is soft X-rays or uv light of spatially coherent light. In one embodiment, the light beam is soft X-rays or uv light of spatially coherent and temporally coherent light.

In one embodiment, the one or more properties of the device under test comprises detecting or measuring a gauge for a void, crack, break, or a gap within the device under test. In one embodiment, the one or more properties of the device under test comprises solder joint defects (such as voids, nonwets, head in pillow, cold joints, solder bleed or excursion, and bridge/shorts) within the device under test. In one embodiment, the one or more properties of the device under test comprises detecting a chemical makeup of one or more portions of the device under test.

Before explaining example embodiments consistent with the present disclosure in detail, it is to be understood that the disclosure is not limited in its application to the details of constructions and to the arrangements set forth in the following description or illustrated in the drawings. The disclosure is capable of embodiments in addition to those described and is capable of being practiced and carried out in various ways. Also, it is to be understood that the phraseology and terminology employed herein, as well as in the abstract, are for the purpose of description and should not be regarded as limiting.

These and other capabilities of embodiments of the disclosed subject matter will be more fully understood after a review of the following figures, detailed description, and claims.

It is to be understood that both the foregoing general description and the following detailed description are explanatory only and are not restrictive of the claimed subject matter.

DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
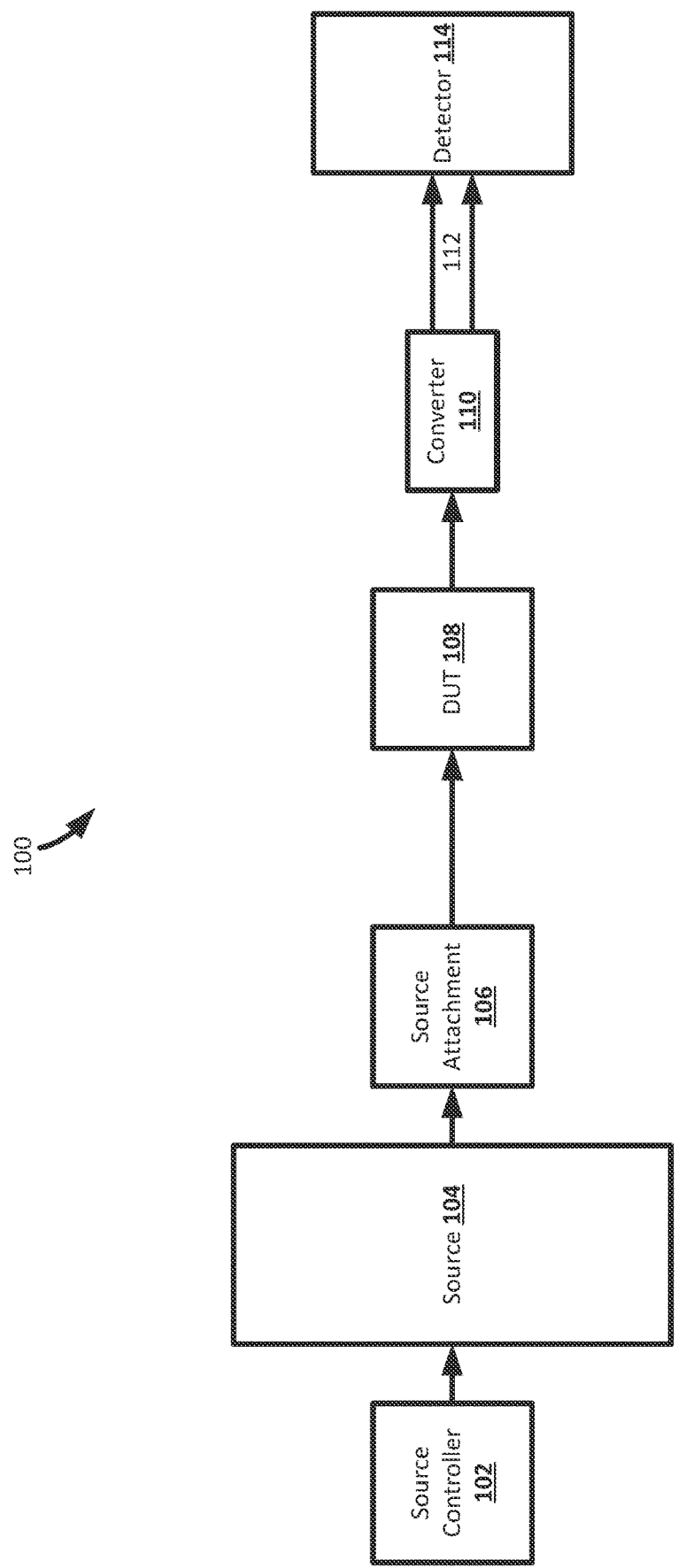
FIG. 1 illustrates a system in accordance with one or more embodiments described herein.

Techniques described herein may be used at least to inspect and accurately determine the physical existence, position, distribution, or size metrology of defects within (1) metal interconnections serving as an electrical connection using a microbump or direct hybrid bond metal trace between chip or chiplet (large scale integration (LSI) logic or Memory Chip) to silicon (Si) interposer or other form of redistribution lines (RDLs) within chip or supporting advanced package substrate such as RDL on glass, RDL on organic high density interconnect (HDI) board, or RDL on printed circuit/wiring board (PCB/PWB) with critical dimensions in the range of 0.01 microns to 5 microns; (2) semiconductor wafer level or panel level packaging for cracks in metal interconnections, both direct metal to metal hybrid bonds and multilayer microbumps in the range of 0.1 micron to 25 microns in critical dimension (length×width or diameter); (3) RDLs and metal plated microvias in various substrates such as HDI boards, embedded boards, hybrid ceramic boards, printed circuit or wiring boards (PCB/PWB), and/or multiplayer system in package (SiP) substrates; (4) microbumps connected to plated through hole silicon vias (TSV's) on a Si chip or Si Interposer or embedded Si components like a Si bridge in organic substate, or within a buildup layer within the copper (Cu) plated vias or through holes in the organic or inorganic substrate; (5) solderless metal to metal connections such as DBI or hybrid bonding in Advanced Semiconductor Packaging; and (6) any other defects or undesirable characteristics within an IC package, component, and/or interconnect between components regardless of the depth or density of said IC package or component such as x,y overlay offset errors or die tilts or total thickness variations (TTVs).

The premise for finding cracks, gaps, or other defects in metal interconnects, Si, or organic and inorganic substrate layers, microvias, and/or microbumps, is to pass finite spatially coherent light waves through a device under test (DUT). In the DUT, a defect such as a gap or crack, will cause a phase shift in light wave front and upon subsequent physical propagation length develop Fresnel fringe interference patterns that quantify the existence, position coordinates, and the physical extent of the defect. These interference patterns can be described as constructive and destructive interference between perturbed portions of the wavefront and unperturbed portions of the wavefront. Interference is detected by allowing the light waves that exit the DUT to propagate at least a certain distance to a first element (e.g., a high Z atomic number material, a scintillator, photocathode, direct semiconductor conversion material, flat panel detector, Cadmium Telluride (CT) or Cadmium Zinc Telluride (CZT) camera) of a video detection chain.

The Fresnel fringe may be proportional to the second derivative of the phase shift in the light waves exiting the DUT. In one embodiment, the light waves, after exiting the DUT, will propagate and develop at a distance of 10 mm to 1 meter. Within this distance, a first element of a video detection chain may be placed in order to accurately determine the Fresnel fringe of the detected light waves. A phase coherent light source interacting with a defect causes Fresnel fringe interferences and these interferences can be elegantly detected in light waves without complicated optical techniques and equipment (i.e., without gratings, monochromators, multi-wave pass parabolic mirrors, partially transmissive optics, Fresnel zone-plates, interference interferometers systems in general, and the like). For example, Fresnel fringe interfaces may be detected with a first element that may consist of the components detailed herein. A unique feature of this disclosure is the use of a light that deeply penetrates through the full ASP thickness allowing for defect detection deep (e.g., greater than 3 microns from the surface of the IC package) within the DUT and its corresponding package.

FIG. 1 illustrates an example defect detection system 100 for performing microscopy and/or spectroscopy on a device under test (DUT). Defect detection/metrology system 100 comprises source controller 102, source 104, source attachment 106, DUT 108, converter 110, electron-optical column 112, and detector 114. Source controller 102 may be a digitally driven source that is capable of periodically turning on and/or turning off source 104 (i.e., source controller 102 may control the operating state of source 104). Source controller 102 may not only be capable of turning on and off source 104, but source controller 102 may be capable of controlling the duration of the on and off time of source 104. For example, source controller 102 may turn on or turn off source 104 in a high-speed manner (e.g., under 100 nanoseconds) for a specific duration (e.g., on for 10% duty of a duty cycle and off for 90% of a duty cycle or vice versa). Source controller 102 may be embodied by a digital pulse generator such as Agilent 81110A, or custom designed circuit for pulsing, as shown in FIGS. 3 and 4.

Figure 3:
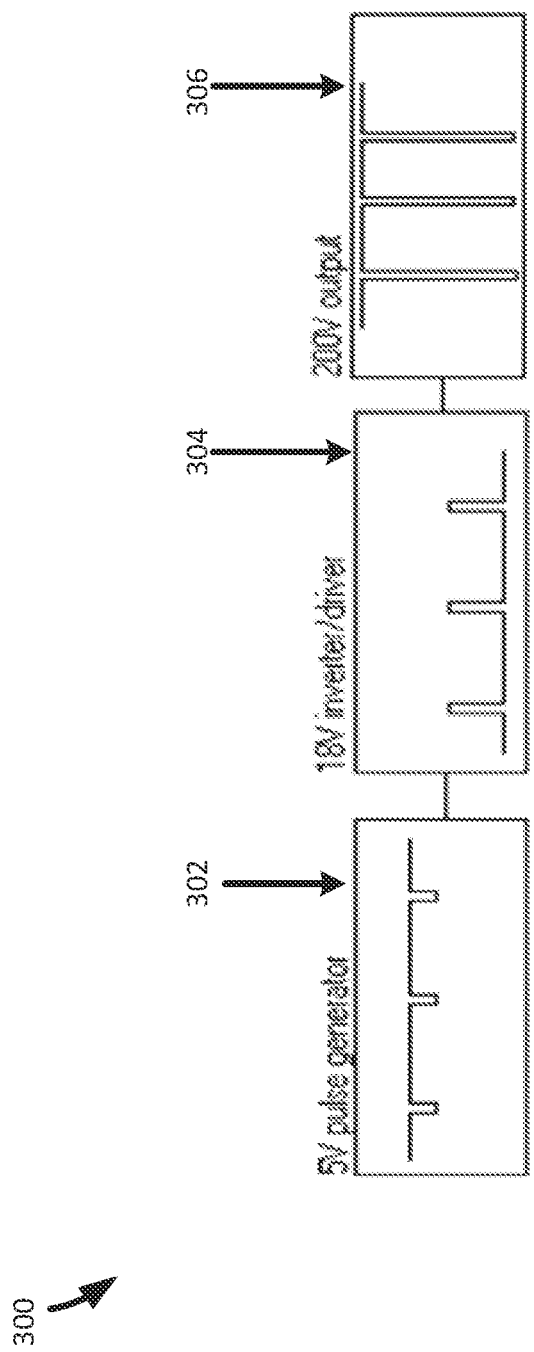
FIG. 3 illustrates a pulse generator in accordance with one or more embodiments described herein.

Now with brief reference to FIG. 3, FIG. 3 illustrates pulse generator circuit 300. Pulse generator circuit 300 is comprised of pulse generator 302 (e.g., a 5V pulse generator), inverter/driver 304 (e.g., 18V inverter/driver), and output 306 (e.g., a 200V output). Output from output 306 may be fed into a source, such as source 104, in order to toggle (i.e., cycle) the source between an "on" state and an "off" state.

Figure 4:
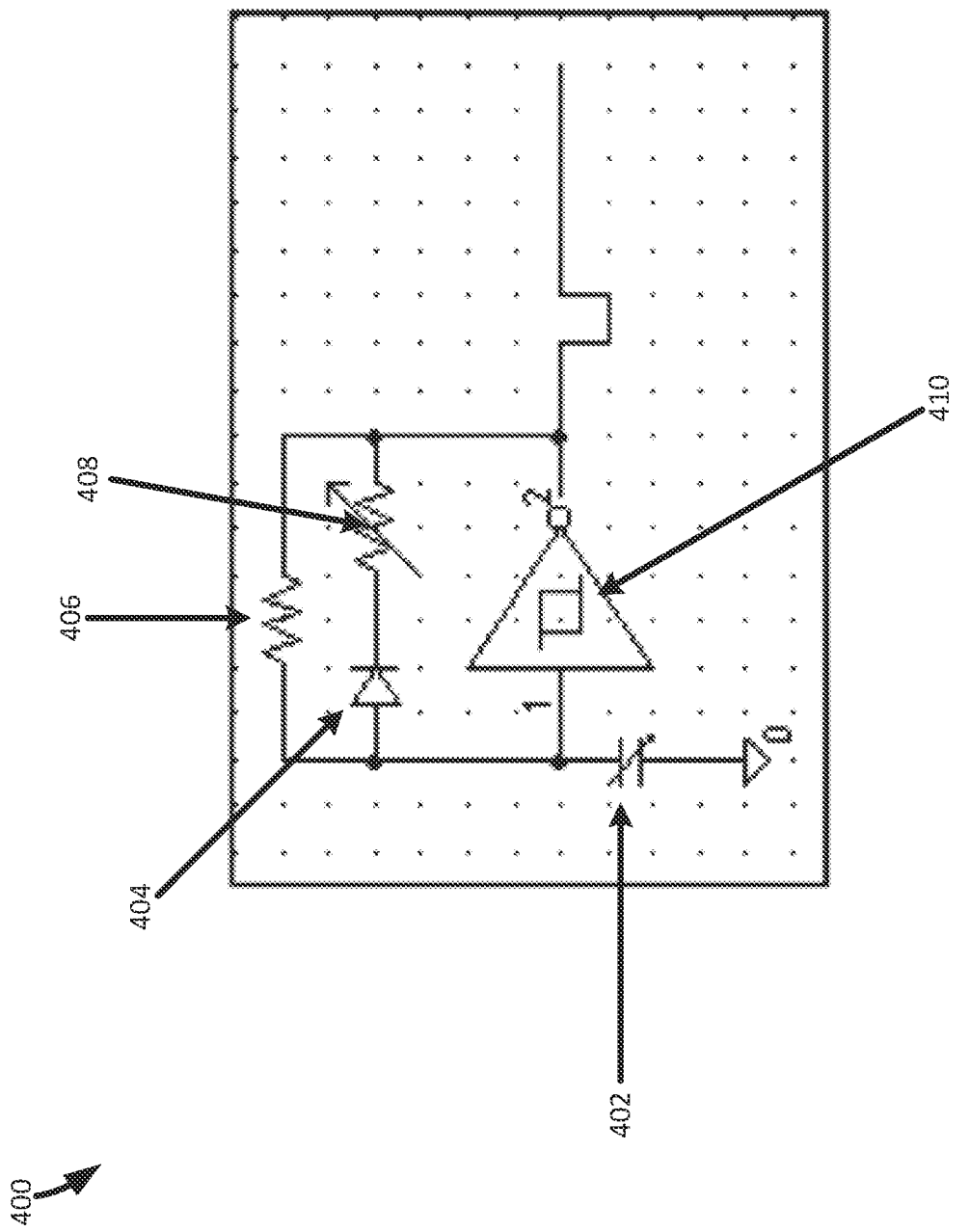
FIG. 4 illustrates a signal source in accordance with one or more embodiments described herein.

Now with brief reference to FIG. 4, FIG. 4 illustrates signal source 400. Signal source 400 may be used to implement pulse generator 302 or may be used as an independent signal source capable of outputting a control signal to a source (e.g., source 104). Signal source 400 comprises capacitor 402 (e.g., a 150 picofarad capacitor), diode 404, resistor 406 (e.g., 15 kilohm resistor), variable resistor 408 (e.g., 300 ohm resistor range), and operational amplifier 410. The output of signal source 400 may be a pulse with configurable duty cycles and rise/fall times in the range of 10 to 100 nanoseconds.

Now with returned reference to FIG. 1, the ability to cycle on and off source 104 via source controller 102 has several benefits for defect detection/metrology system 100. One such benefit is the ability to remove unwanted noise from measurements taken by defect detection system 100. Some types of electrical and mechanical noise sources may only appear at certain frequencies and by tuning the "on" frequency of source 104 to a specific value (using source controller 102). For example, lock-in detection using a phase-lock loop (PLL), such as HF2LI-PLL from Zurich Instruments, removes noises at those certain frequencies that occur outside the frequency window set by the lock-in frequency. As a result of the lock-in frequency, noises may be avoided. Avoiding such noises may lead to less interference (or distortion) when performing digital image acquisition leading to higher fidelity morphology analysis in microscopy or higher accuracy/precision for materials or chemical analysis in spectroscopy on DUT 108. Another benefit is the potential to irradiate less with electromagnetic waves onto DUT 108 during microscopy or spectroscopy. In other words, the total ionizing radiation dose ("TID") when the electromagnetic waves are in the X-ray regime is precisely controlled by counting the number of "on" pulses delivered and accurately turning off the radiation at sub 100 nanoseconds times (also known as a pulse width modulation approach for dose control with nanosecond accuracy), controlling and thereby limiting the total ionizing dose in any given area. The accuracy and precision of dividing the "on" dose into 10-100 nanosecond pulses is the first TID control down to <10 microRads per pulse accuracy and <1% 3 sigma for repeatability or precision which is 10× less than an airport X-ray scan. In summary, because source 104 may be turned on or off with sub 100 nanosecond timescales, the electromagnetic waves emitted from source 104 may also be toggled on or off, which controls the amount of exposure or total ionizing dose DUT 108 has to said electromagnetic waves in the X-ray regime. This limited exposure may be particularly useful in non-destructive testing of memory containing electronic circuits that are easily damaged by X-rays where damage to DUT 108 could be avoided with limited exposure to electromagnetic waves. Furthermore, by limiting the amount of "on" time for source 104 by controlling the duty cycle or period the source is on, the overall product lifetime of source 104 may be extended (as opposed to source 104 being continuously operated when considering 24/7 operation typical of high-volume manufacturing environments). Yet another advantage may be the ability to quickly take multiple images of DUT 108. By turning on and off source 104, images created by source 104 may be rapidly changed, which may allow for multiple image averaging, including images created by dynamically switching magnification corresponding to the same location on DUT 108 measured at two or more magnifications within a relatively short time. For example, a measurement cycle (i.e., the time it takes defect detection/metrology system 100 to image a particular location of DUT 108) may be less than 500 milliseconds. In such an example, for a first series of images, a first trigger signal, from source controller 102, may turn on source 104 for 20 milliseconds and turn off source 104 for 20 milliseconds (or a 50% duty cycle with a rise/fall time of 10-100 nanoseconds). During the "on" time, a first magnification (M=1×) is set to achieve a 2.5 micrometer resolution image with a field of view of 20 millimeters×20 millimeters and an ensemble average of five 20 millisecond images in total for a total time of 200 milliseconds (50% of the time the source is "on"). In a continuation of the example, a second series of 20 millisecond images are acquired with a 50% duty cycle, but now defect detection system 100 shifts from a 1× magnification to 167× and produces a 15-nanometer resolution image with a field of view of 120 micrometers× 120 micrometers, and again five images are ensemble averaged for a total time of 200 milliseconds (100 msec "on" and 100 msec "off"). The total acquisition cycle (for the first and second series of images) is 400 milliseconds. Source 104 may then be moved with respect to DUT 108 to image a different location of DUT 108 and more series of images may be obtained repeating the measurement cycle; this is known as simultaneous large area inspection and fine localized defect review. As can be seen, controlling source 104, via source controller 102, has several benefits including being able to quickly image DUT 108 at different magnification levels. The ability to quickly image enables perfect registry of two or more field of views at two or more magnifications with sub-second acquisition times. This facilitates easy super-resolution calculations and AI inference and directly converts the low-resolution image into high resolution using an AI inference without the need to scan the whole area at higher resolution. In one embodiment, the ability to quickly image enables performing 100% coverage at low magnification defect inspection, followed by a sparse sampling in high resolution defect review in tandem for any defects found with the coarse low magnification image (dual inline defect review tool with high-speed inspector all in one).

Source 104 may be a source for emitting electromagnetic or light rays that are capable of fully penetrating DUT 108, such as but not limited to hard (>1 keV) and soft X-rays (<1 keV). Source 104 may be referred to as a light emitting device. In one embodiment, source 104 may be a source for emitting hard X-rays. Hard X-rays may be produced when charged particles such as electrons are accelerated or deaccelerated. Hard X-rays may be produced by a variety sources, including, but not limited to, synchrotron, betatron, rotating anode source, fine-focus sealed tubes of various forms, liquid jet X-ray source, pulsars from crab nebulae, free electron lasers, plasma impinging on a metal, and LASER Wakefield sources. Source 104 may be an incoherent (with respect to space and/or time) electromagnetic wave source with a radiation spectrum from 0 keV to 300 keV. In one embodiment, source 104 may be embodied by an X-ray machine, such as a traditional point project system for Computed Tomography (CT) X-ray or 2D automated X-ray Inspection ("AXI"). In one embodiment, source 104 may be embodied by a Carbon Nanotube (CNT) X-ray, liquid jet anode X-ray, or rotating anode X-ray source. In one embodiment, source 104 may be coherent in part both spatially and temporally, such as synchrotron, electric discharge LASER, high harmonic generation HHG LASER, and LASER Wakefield source.

X-rays may be capable of fully penetrating DUT 108. If two metal lines of thickness 0.5*d are placed in physically overlapping contact using a cross pattern, an interconnect region of interest will form with a total thickness of d. The resulting absorption of incoherent X-rays passing through this region of interest is described by Beer's law, which states the transmitted X-ray intensity is equal to the unaltered initial intensity multiplied by an exponential factor. In the exponent, the negative product of the mass absorption coefficient is multiplied by the density of the material and the thickness d of the overlap. This attenuation (i.e., decrease in impinging intensity that is reduced upon transmission by the fully penetrating X-rays) calculation comprises the fundamental mechanism behind forming intensity-based grayscale images from changes in intensity that represents a projected thickness map in DUT 108 for 2D/3D X-ray microscopy. In one instance where the two metal lines (that were in contact) are now physically disconnected by a small air gap of any thickness (e.g., an electrical open with resistance of less than 1 megaOhm measured between the lines can be Angstroms), the resulting attenuation of the X-ray intensity shows no difference when compared to the direct (i.e., overlapping) contact case. This illustrates a limiting condition in using incoherent X-rays for microscopy or inspection of cracks, breaks, or air gaps in devices such as direct Cu bonding or hybrid bonding, and even more challenging when X-ray interaction is weakly interacting with Si for cracked Si dice, such as die edge cracks in corners or backside hairline cracks commonly found in mounting/demounting thin dice. That is, there is no unique manner to determine if there is a physical disconnect or break in components within DUT 108 by transmission inspection using a pixelated camera or video chain. However, the limitations of incoherent X-rays for microscopy may be circumvented, in part, by bringing the incoherent X-rays into spatial phase coherence. By creating a spatially phase coherent X-ray (temporal coherence may still be random), defect detection system 100 may utilize both the X-ray attenuation (of intensity and/or amplitude) and changes in phase coherence (after penetration of DUT 108) to perform microscopy of DUT 108. By creating a spatially and temporally phase coherent X-ray, defect detection system 100 may utilize both the X-ray attenuation (of intensity and/or amplitude) and changes in both spatial and temporal phase coherence contrast (after penetration of DUT 108) to perform microscopy of DUT 108. It should be noted that while this disclosure presents many examples utilizing X-rays and X-ray sources, any electromagnetic wave or electromagnetic wave source that is capable of fully penetrating DUT 108 may be used. The air gap, cracks or breaks in solids (metals, insulators, or semiconductors) may be probed and detected.

If source 104 is incoherent, source attachment 106 may convert incoherent electromagnetic waves emitted from source 104 into phase coherent electromagnetic waves. Source attachment 106 may comprise one or more of: a capillary, a polycapillary glass, or a metal coated glass tube (comprised of elements such as gold, chromium, molybdenum, and their combinations), a glass nano or micro channel plate, or a metal coated glass nano or micro channel plate (comprised of elements such as gold, chromium, molybdenum, and their combinations), or a tungsten waveguide comprised of a plate with nano or micro channels either drilled by conventional wire EDM machining, or 3D formed using additive manufacturing using high power laser sinter techniques of tungsten alloy powders. Source attachment 106 may guide a portion of the emitted electromagnetic waves. Source attachment 106 can be crafted in a thermal heating environment to shape source attachment 106 in a parabolic shape. The purpose of the shape is two-fold: (1) to convert incoherent electromagnetic waves into waves with high spatial coherence, and (2) to collimate electromagnetic waves by generating multiple bounces down the inner walls of source attachment 106 due to total external reflection.

Source attachment 106 may accept a narrow range of acceptance angles that is proportional to twice the critical angle for total external reflection. Source attachment 106 is expected to catch between 1-10% of the incoherent electromagnetic wave power emitted from source 104 (depending on the keV energy range when converted to wavelengths and moreover critical angles are functions of keV energy). Source attachment 106 may emit a collimated beam having a cross-sectional diameter in the range of 0.1 millimeter to 25 millimeters. Additionally, an effort can be made to couple multiple source attachments in a larger array of source attachments to increase the physical cross-section of the emitted collimated beam to a total diameter in the range between 25-650 millimeters effectively. Stated another way, by increasing the number of source attachments it may be possible to increase the diameter of an emitted phase coherent electromagnetic wave (e.g., a phase coherent X-ray). It should be noted that source attachment 106 does not need to be physically attached to source 104, but instead may be attached in the sense that source attachment 106 is able to receive at least a portion of emitted electromagnetic waves from source 104. Source 104 in combination with source attachment 106 may be referred to as a light emitting device.

Although spatial phase coherence may be achieved with the combination of an incoherent source and a source attachment as previously described, it is within the scope of this disclosure to use any type of device or mechanism that is able to produce spatially and temporally phase coherent electromagnetic waves that are capable of fully penetrating DUT 108.

DUT 108 may be a semiconductor wafer or advanced semiconductor package comprising a plurality of components, partially or fully processed to completion. It may also be any other substrate used in the manufacture of microelectronic circuits or the like. A component may be any part of a semiconductor, optoelectronics, or sensing devices based on ferro, capacitive, inductive, or piezoelectric devices, or more traditional electronic devices in the form of an integrated circuit or application processor chip including memory, or logic chips, or passive components such as resistors, inductors, capacitors (MLCC's), or interconnect metal lines and traces such as redistribution lines, Cu metal planes in buildup substrates, and connectors, and the advanced semiconductor package includes but is not limited to: bumped wafer, System on IC (SoIC), fan-out wafer level package or FOWLP such as eWLB, FOcus, and InFO, or a Panel Level Packaging (PLP), fan-out panel level packaging (FOPLP), fine line redistribution lines (RDL) on substrates without Si interposers (high density interconnect or HDI with imbedded bridges or RDL on glass, other HDI printed circuit or wiring boards or PCB/PWB), Si interposers such as through Si-vias or TSV stacked wafers, Chip/Chiplets on Wafer (CoW), Chip/Chiplets on Wafer on Substrates (CoWoS), Chips/Chiplets on Substrates using flip chip technology, embedded Chips/Chiplets in Substrate, wafer to wafer direct bonded interconnects or chip to wafer direct bonding also known as hybrid bumped components, and the like. Electromagnetic waves that deeply penetrate DUT 108 (from source attachment 106) are subsequently received by converter 110 to determine one or more differences in the phase coherence and intensity map representation as like part to parts or like region of interest (ROI) to ROI's are compared to each other in order to measure variation in a gauge or derived feature, process excursions, marginal or completely defective components (e.g., submicron defects including but not limited to: cracks, breaks, or gaps in metal components, multifold Si dice, and the substrate organic materials or metal buildup layers or plated Cu vias or Si bridges, or any conventional solder joint defects such as aberrant size or missing bump, voids, nonwet/cold joints, open/short defects, head in pillow, or gauge for RDL lines and spaces, or x,y,z chip overlay errors) in one or more components of DUT 108. These defects or gauges for metrology may be determined based on the attenuated intensity in combination with phase coherence disturbances (i.e., changes in the electromagnetic waves spatial or temporal phase coherence) of electromagnetic waves received by converter 110.

Converter 110 is a device capable of converting electromagnetic photons (e.g., hard or soft X-ray photons) to secondary electrons also known as photoelectrons. In one embodiment, converter 110 is a photocathode. In one embodiment, converter 110 is a photocathode comprised of a high Z atomic number. In one embodiment, converter 110 is the combination of an anisotropic film or layer followed by a photocathode comprising a transmissive device through close contact but separable with a high Z atomic number layer that has anisotropic absorption coefficient favoring the direction of propagation (parallel to the optical axis) and in close proximity with a zero barrier (negative affinity NEA) or near zero barrier photocathode. In one embodiment, converter 110 is an anisotropic multilayer photocathode comprising of: a transmissive device through direct chemical or physical growth and is not separable, a high Z atomic number thin film layer that has either artificial anisotropy by nano or micro patterning of a film, fabrication of a glass or metal element(s) (capillaries, pipes, or nano or micro channel plates) with a scintillator filling the glass or metal channels in the direction of propagation (parallel to the optical axis), a chemically anisotropic absorbing film comprised of an organo-metallic perovskite, or the like in direct chemical contact with a zero barrier (negative affinity NEA), or a near zero barrier photocathode. Once electromagnetic waves propagate through DUT 108 a shadow-gram map (i.e., the shadow-gram transferred image) is created from both intensity and spatial phase or spatial and temporal phase coherence information (phase contrast). The shadow-gram is an image encoding both attenuated intensity and phase shift maps in the deeply penetrating electromagnetic waveform. Converter 110 takes the received shadow-gram and translates it to a photoelectron contrast image (i.e., a new photoelectron image map) that maintains the intensity variation and phase shift information originally in the electromagnetic wave map (now a photoelectron image in electron-optical column 112). In one embodiment, spatially or spatially and temporally coherent X-ray photons will enter converter 110 in normal incidence with respect to the surface to minimize the path length through converter 110. The X-rays have some probability for being absorbed by converter 110, and whose attenuation length is many times greater (>>10×) than the inverse probabilities for interaction with converter 110 (also length scales); the dominant scattering mechanisms dictate the conversion or creation of photo-generated secondary electrons (i.e., photoelectrons) created within the thickness of the photocathode or anisotropic multilayer photocathode. In other words, there is a 3-step process: (1) absorption of X-ray photon and generation of a first secondary electron, (2) scattering transport of secondary electron to emitting surface of the converter 110, and (3) if the energy is above the vacuum level at the surface, measured with respect to the electron affinity, the secondary electron is emitted into vacuum and leaves the converter 110 and is ready for subsequent extraction, focusing, and collection from free space or vacuum system in electron-optical column 112. In one embodiment, converter 110 is in contact with a metal element that is comprised of flowing liquid nitrogen or liquid helium to cool down the photocathode or anisotropic multilayer photocathode to a temperature in the range of 4 degrees Kelvin to 77 degrees Kelvin. This cooling reduces the transverse and longitudinal energy spreads of the photoelectrons to less than <7 meV (milli-electronVolts). In one embodiment, features of converter 110 include: a low energy relaxed tail that is common for all materials as secondary electrons lose energy through scattering in converter 110's conduction energy bands as they transfer to the emitting surface. If the relaxed distribution is fitted by an asymmetric function (e.g. weighted Lorentzian or other), the full width at half maximum (FWHM) is in the range of 25 meV to 100 meV (1 meV=$1\times10^{-3}$ eV) for the negative electron affinity photocathodes and the range of 0.5 eV to 5 eV for positive electron affinity photocathodes, and the majority of the carriers that transmit through the photocathode and successfully emit into vacuum exist in this secondary electron distribution forming a relaxed tail distribution. A minor portion exists without relaxation, also known as "hot electrons" that may be emitted at the original energy of absorption in the range of 5 eV to 10,000 eV depending on the original shadow-gram X-ray energy. These electrons may yield composition information related to X-ray fluorescence of the DUT.

At least due to the use of converter 110, there are two modes that can be derived by producing the shadow-gram utilizing spatially or spatially and temporally coherent X-rays or uv light originally derived from an incoherent X-ray tube or uv lamp through source attachment, or a coherent X-ray or uv light source without the source attachment. The first mode is microscopy for direct photoelectron imaging in electron-optical column 112 (low energy microscopy mode), and the second mode is spectroscopy by analyzing the "hot electrons" and performing an energy loss tail analysis in the elastic scattering at high energy of the hot electrons, Auger electron oscillations, and the elastic scattered peaks (sometimes referred to as EELS or electron energy loss spectroscopy). In one embodiment, spectroscopy may be achieved by utilizing a mesh or grid in electron-optical column 112 and applying an adjustable retarding electric field analysis to separate out the photoelectrons by arrival energy in the final collection video chain detector or camera (i.e., only collect electrons that can overcome a retarding electric field in a step-wise adjustable fashion to report an energy distribution across the image formed). Any person well versed in the art of electron-optical column design may also suggest alternative methods to energy analyze the photoelectrons, such as but not limited to, time of flight ("TOF") analysis utilizing quadrapole/multi-pole energy analyzers, cylindrical mirror analyzers, Hemi-spherical mirror analyzers, or TOF counters using path length adjustments such as bending magnets or other means to generate differences in path length traversed or total time to a collection sensor or detector.

Converter 110 may have design elements that are critical in achieving an accurate conversion of a shadow-gram to a photoelectron contrast image. A first design element may be that converter 110 comprises of active conversion layer(s) with a critical thickness in the range of 1 nanometer to 1000 nanometer for electrons with kinetic energies in the range of 10 eV to 300 keV (1 keV=1000 eV). A second design element may be that converter 110 comprises an electrically conductive layer that has a thickness in the range of 0.1 nanometer to 10 nanometers. A third design element may be that converter 110 has a total thickness (including a mechanical support structure with coatings, anisotropic multilayer(s), fiber bundles, patterned glass or metal channels or pores, conductive layers, and active conversion layers such as the photocathode) that is less than the diffraction limit or square root of the product of wavelength of the incoming X-rays or uv light multiplied by the total thickness of the converter. A fourth design element may be that converter 110 has a large secondary-electron yield for the active conversion material facing vacuum. A fifth design element may be that the converter 110 has a first layer with high X-ray or uv light stopping power, including but not limited to large Z atomic number elements. A sixth design element may be that converter 110 has an anisotropic X-ray or uv light absorption that is preferentially absorbing parallel to the propagation direction of light or aligned parallel to the optical axis. When converter 110 is comprised of more than 1 conversion material, the layer that is desired is in direct contact with the vacuum system and embodies the large secondary-electron yield or large quantum efficiency or quantum yield relating to the proportion of photoelectrons exiting with respect to the number of incident X-ray photons. In summary, this patent teaches a converter 110 that emits photoelectrons efficiently with secondary-electron yield greater than 0.1 electrons emitted to every incident photon absorbed (i.e. high secondary yield or high efficiency photocathode) and with a transverse and longitudinal energy spread that can be reduced below <7 meV for optimum electron microscopy resolution and spectroscopy accuracy.

Converter 110 may be comprised of various materials for the active layer connecting to vacuum including: alkali halides such as cesium bromide (CsBr), rubidium iodide (RbI), sodium iodide (NaI), potassium iodide (KI), cesium iodide (CsI), rubidium bromide (RbBr), sodium chloride (NaCl), potassium chloride (KCl), copper iodide (CuI), pure metals such as aluminum (Al), copper (Cu), gold (Au), various direct wide bandgap semiconductors such as aluminum nitride (AlN), aluminum gallium nitride (AlGaN), including the intermediate formulations in the full solid solution for any atomic ratio of Al to Ga in aluminum gallium nitride, gallium nitride (GaN), various II-VI semiconductors with high stopping potential for hard X-ray energies such as cadmium zinc telluride (CZT) or cadmium telluride (CdTe), or more traditional elemental semiconductors such as crystalline c-Diamond, amorphous Diamond, Diamond like carbon, or conventional III-V semiconductors such as gallium arsenide (GaAs), indium phosphide (InP), or any combination within the full solid solution of InGaAsP. Lastly, any material described herein, may include a chemical overlayer designed for dipole formation to reduce the work function or electron affinity; dipole forming chemical surface layers that are known to those well versed in the art of photocathodes but not limited to, such as hydrogen, cesium (Cs) or any other alkali element (iodine, chlorine, potassium, bromine) or alkaline earth element (barium, strontium), and alkaline oxides such as cesium oxide/sub-oxide (CsO), or any column II alkali metal with or without oxygen incorporation. In all cases oxygen may be replaced by fluorine. The active layers above can be combined with a high Z atomic number layer to form a converter 110 in the form of an anisotropic multilayer photocathode.

Figure 5:
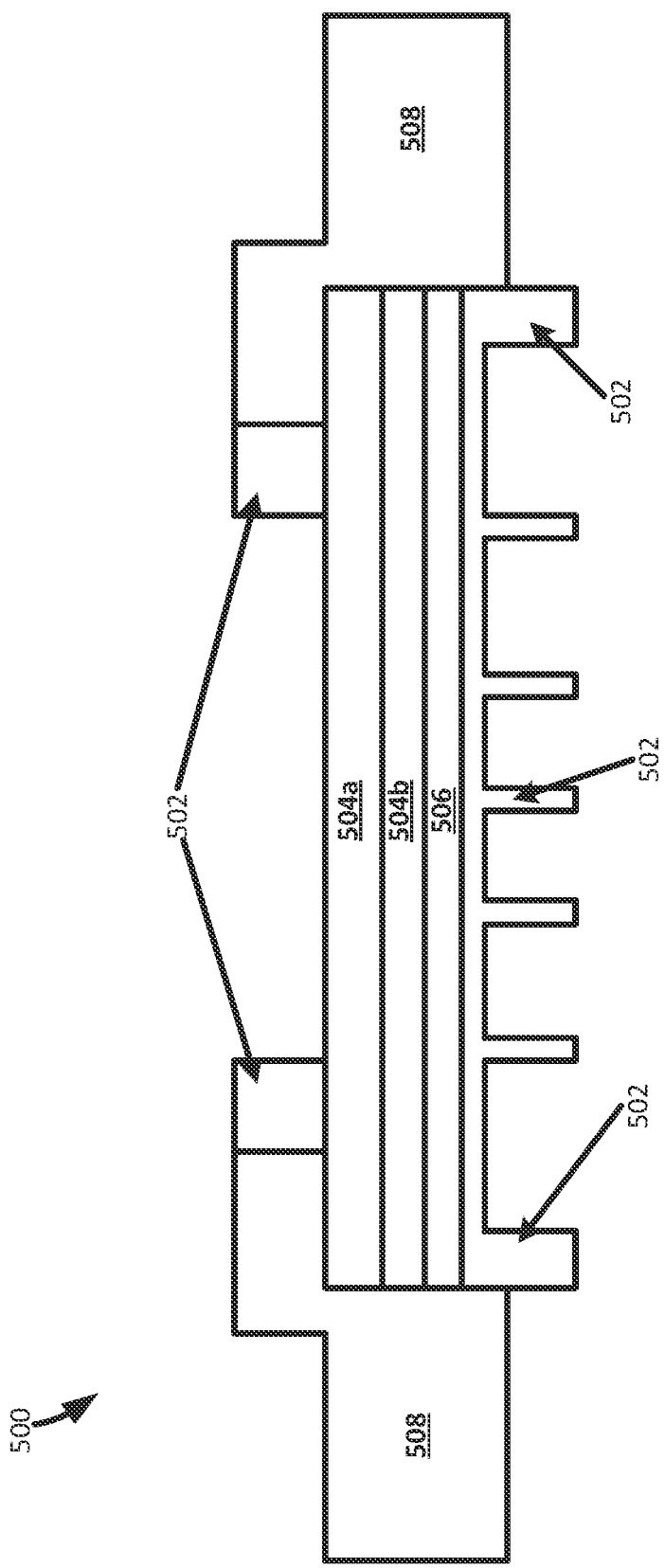
FIG. 5 illustrates a converter in accordance with one or more embodiments described herein.

Now with brief reference to FIG. 5, FIG. 5 illustrates anisotropic multilayer photocathode 500. In one embodiment, converter 110 may be embodied by photocathode 500. Photocathode 500 comprises electrically conductive layer 502, X-ray or uv light stopping power layer 504, photocathode active material layer 504b, surface activation layer 506, and photocathode support material 508. Electrically conductive layer 502 may be comprised of a thin metal or thin layer sheet conductor such as chromium or graphene with a thickness range of 0.1 to 10 nm. The X-ray or uv light stopping power layer 504a may be fabricated from a high Z atomic number material such as CdTe or CZT with nano or micro scale pillars or islands. The X-ray or uv light stopping power layer 504a may be fabricated from the channels or pores of glass fiber, glass nano or micro channel plates, machined tungsten or laser sintered tungsten or tungsten alloy whose pores or channels are chemically filled by a conventional scintillator (GaGG, LYSO are preferred) with a thickness of 10 to 1000 nanometers. The X-ray or uv light stopping power layer 504a may be fabricated from anisotropic organo-metallic perovskite film, in general, but $(NH_4)_3Bi_2I_9$ is preferred with a thickness of 10 to 1000 nanometers. Photocathode active material layer 504b may be comprised of CsI that is 10 to 1000 nanometers thick and with a surface activation layer 506 that may be comprised of pure Cs that is less than one monolayer thick, or a cesium oxide that is <10 monolayers thick. Photocathode active material layer 504b may be comprised of indium gallium nitride (InGaN) with a bandgap energy of 1.8 eV, or gallium indium arsenide phosphide (GaInAsP) with a bandgap energy of 1.7 eV, or indium phosphide (InP) with a bandgap energy of 1.34 eV, or gallium arsenide (GaAs) with a bandgap energy of 1.4 eV, and all the like are optically matched to light emission of bis-ammonium iodide $(NH_4)_3Bi_2I_9$ in the range of 1.7 eV to 2.04 eV and are 10 to 1000 nanometers thick and with a surface activation layer 506 that may be comprised of pure Cs that is less than one monolayer thick, or a cesium oxide that is <10 monolayers thick. Photocathode support material 508 may be comprised of conductive glass or ceramic, or Silicon that is easily etched and coated with a thin layer of Silicon nitride. typical substrates are in the range of 50 um to 1 mm thick and coatings are less then 10 nm in thickness. The anisotropic multilayer photocathode 500 is in thermal contact with a metal ring or "metal finger" comprised of copper Cu, beryllium copper BeCu, or tungsten W, or an other high thermal conductivity metal with a liquid He or liquid Nitrogen flow tube or path in order to bring anisotropic multilayer photocathode 500 into thermal equilibrium with a temperature in the range of 4 Kelvin to 77 Kelvin; delivering emitted photoelectrons to vacuum with transverse and longitudinal energy spreads <7 meV. Cooling may not be required to image 10-100 nanometer length scales using electron optical imaging systems, and employing emitted electrons to vacuum having transverse and longitudinal energy spreads in the range of 25 meV to 100 meV set by room temperature in NEA photocathodes.

In one embodiment, within defect detection system 100, converter 110 coverts a shadow-gram of X-ray intensity and phase shifts creating a 2D map emanating from DUT 108 into a photoelectron contrast image or 2D electron map with electron energies in the range of 0 keV to 20 keV. Due to the use of converter 110, the shadow-gram conserves resolution because the inelastic mean free paths are held to a preferred range (e.g., less than 100 nanometers for hard X-rays). When X-rays transport through converter 110, a shadow-gram of secondary low energy electrons (i.e., a photoelectron contrast image) is generated that is subsequently accelerated in energy and imaged by an electron-optical column or system terminated by a collection element or detector or camera (e.g., detector 114, an example is the combination of low-profile phosphor bonded through fiber bundle window to CMOS, sCMOS or CCD digital camera).

The use of converter 110 within defect detection system 100 has several advantages. A first advantage is that the efficiency for the subsequent imaging contrast can be greater than 30%. This high efficiency is due in part to the fact that converter 110 converts received electromagnetic waves into photoelectrons and these photoelectrons are then detected by detector 114. A second advantage is there is not a first order limitation presented by converter 110 with respect to the traditional optical tradeoff between depth of field resolution and the primary signal generated to achieve good signal to noise ratio as experienced by a visible light optical system using a scintillator to light optics (i.e., objective and transfer lens system) and the final focus lens to digital camera for detection. A third advantage is an enhanced magnification stage in the range of 100 to 10,000 while maintaining a large depth of field (DOF) greater than the thickness of the device under test, because the shadow-gram is now represented in a photoelectron distribution image where depths of field can be approximately 50 to 100 millimeters for hard X-rays compared to 1-10's of micron for high magnification light optics. In the latter case, using shorts DOF requires thinning the scintillator to avoid unwanted blurring and this thickness constraint creates a severe loss in total signal. This engineering tradeoff to avoid blur limited by the DOF optical focusing system generates insufficient signal for fast imaging applications. Whereas this limitation can be overcome by a photoelectron system with monochromatic electrons, and additionally, photoelectrons emitted can be placed through electron gain stages such as microchannel plates in vacuum to boost overall signal prior to electron optical imaging. A fourth advantage is that electron optics shift the diffraction limit to sub-Angstrom whereas a purely visible light system is diffraction limited to 300 nanometer resolutions. This is not the case for electron optics (wavelengths are inversely proportional to the energy/momentum of the photoelectron). Typical electron-optics do not achieve their theoretical diffraction limits but instead are limited by the aberration coefficients of the electro-magnetic lenses. In this case this extends the ultimate resolution by 20-3000× times reaching absolute imaging range of 0.1 nm to 15 nm (1 nm=nanometer). A fifth advantage is the ability to perform spectroscopy on DUT 108. Due to the unique image contrast (of the photoelectron distribution image), analysis based on energy separation and energy binning of the spectrum from low to high energy is possible. Such analysis may be used to determine physical and chemical information or material analysis of various components under study across all locations imaged within DUT 108. A sixth advantage is physical resolutions of photoelectron distribution images may extend far below the range of light optical systems, such as 0.1 nanometers to 100 nanometers. A seventh advantage is the ability to enable real-time digital adjustment from a nanometer scale to a micrometer scale resolution by adjusting the electron optics to magnification equal to 1× projection and then re-setting magnification to any value >100× in the electron-optical column 112. The resolution at magnification 1× is set by exterior viewing system's pixel pitch or detector 114 that has typical pixel pitches in the range of 1.0 micrometer to 5.5 micrometers for CCD or CMOS or sCMOS cameras. This pixel pitch may be reduced further by piezo motor control such as nano positioners connected to the various camera arrays that can add vertical or horizontal sub pixel shifts. Such a practice may allow rapid image acquisition to achieve simultaneous and different resolution scales (e.g., nanometer and micrometer scale imaging), enabling a single system to supply both inspection and defect review in fast parallel succession, including computer generated nano tomography. More advantages realized by using converter 110 may be apparent to those skilled in the art.

Once converter 110 creates a photoelectron distribution image from electromagnetic waves that propagated through DUT 108, the photoelectron distribution image is transmitted, via electron-optical column 112, to detector 114. Electron-optical column 112 may be a high vacuum environment between converter 110 and detector 114. The electron-optical column 112 may be used to guide the photoelectrons of the photoelectron distribution image to detector 114. In one embodiment, the electron-optical columns will be compromised of 1 or more electromagnetic lenses with a single extraction voltage electrode displaced in the range of 0.5 mm to 5 mm from the photocathode surface. This first lens is known as the Einzel lens, comprised of the extraction electrode followed by three metal plates (i.e., three circular metal plates with three concentric apertures or openings along their center lines). The central metal plate is held positive with respect to the outer plates forming a focusing element lens for photoelectrons that have been initially accelerated by the extraction electrode from the photocathode surface. Subsequent elements may exist, but not limited to, comprised of a second electromagnetic lens with multiple wire loops wrapped around a bar of soft iron with a cylindrical cross-section, the magnetic path is completely enclosed around the wire loops with a single gap in the iron to allow a leaking electromagnetic field to emanate away from the lens and toward the electron columns central axis of symmetry. This small leaking field will accelerate photoelectrons that have veered off axis back toward the central axis of the electron-optical column 112 and those on axis to feel zero acceleration or zero bending force (i.e., continue straight paths along the central axis). Other elements common place include beam limiting apertures (at least one in the back focal plane of the first Einzel lens), multipoles for deflection correction and astigmatism correction in the final image (quadrapoles, octapoles, or multi-poles), and any additional transfer lenses similar to the first condenser in construction but whose function it is to project and properly overfill the phosphor screen to fiber bundle terminating the electron-optical column 112. Lastly any electromagnetic lens may be replaced with a purely electrostatic lens formed by three element plates similar to the Einzel lens. It will be known to anyone well versed in electron-optics design that the shape of the electrodes, their thickness, the separation of gaps, strength of the fields, placement of the lens elements with respect to each other, and the shape of the soft iron pole pieces all contribute to minimizing the spherical, and chromatic aberrations and require optimizing to achieve 10-15 nm resolution entitlement taught in the art within this patent. In one embodiment, the electron-optical column 112 is in magnification mode. Electron-optical column 112 may be a Low-Energy Electron Microscope (LEEM) style electron-optics or a Photoemission Electron Microscope (PEEM) style electron-optics.

Detector 114 receives, via the electron-optical column 112, photoelectrons. Detector 114 may, utilizing an internal or external processor, generate one or more electronic maps from the photoelectrons received from converter 110. The processor may receive one or more frames. Each frame may contain a photoelectron distribution image in space and in energy. Within each frame or in comparing a multiplicity of frames, algorithms can be derived to compare phase contrast differences across similar regions of interest within a semiconductor wafer or advanced semiconductor package and their constituent circuit elements in DUT 108. Moreover, the comparisons determine variations from like part to like part or like ROI to ROI; the differences are used to find outlier defects or to flag circuit elements that have varied outside of process control limits that represent good product. Without limitation, these similar regions of interest should be identical when variance is reduced to zero and the residual differences represent a direct measure for: process tolerance or precision to tolerance repeatability, variations within gauges or critical sizes or dimensional metrics, or catching critical physical defects in the integrated die and interconnection of dies due to excursion faults in assembly processes. Examples of critical defects not visible prior to this art include cracks (e.g., gross or hairline), breaks, and gaps in semiconductors (such as silicon, cadmium zinc telluride or CZT, gallium arsenide or GaAs, gallium nitride or GaN, silicon carbide or SiC, or others), imperfections in dielectrics such as high-k or silicon dioxide, insulators of various forms, and metal interconnections (direct metal to metal such as copper hybrid bonding, or solder joint connections or the under bump metals used in thermal compression bonding of chips or flipchip BGAs in mass reflow), and defects in non-conductive molding compounds described herein, or variations in thin film composition or elemental analysis for process control such as composition of high k dielectrics in front-end transistor fabrication or the chemical makeup of intermetallic compounds (IMCs) needed to block out diffusion of metals or movement of metals in general. Moreover, the data analytics derived for the cracks, breaks, and gaps due to the phase shifts or physical defects causing disturbances in attenuation within the shadow-gram are reported in physical x, y, and z positions for the physical crack, break, or gap defects under question, with the metrology or physical spatial extent or size of the defect or any other gauge being determined. The burden of human interpretation, along with limited perception to human grey scale is avoided by the automation of the defect or difference image capture detection video chain using a highly sensitive detector 114 (e.g., a video chain) in tandem with automated algorithmic routines based on both intensity and phase shift map difference detection or changes to interference fringes derived from the phase coherence difference images, subsequently converted to nanometer scale image analysis to assess morphology or composition variations. It is known to those well versed in machine learning and artificial intelligence that automated defect classification (ADC) can be subsequently performed on large images at low resolution, using the "self" generated labels derived from the high-resolution images from the same imaging system. Techniques described herein allow, for the first time, self-consistently generated labels by the same instrument in a single measurement cycle.

Detector 114 may be implemented by a phosphor screen coupled to a microchannel plate (MCP) gain stage and further coupled to a fiber couple window for high efficiency conversion to a digital camera with high pixel count such as scientific CMOS or regular CMOS, or conventional CCD. The CMOS, sCMOS, or CCD camera converts the received signals into electronic signals for signal conditioning and image processing. Achievable viewing pixel resolution for detector 114 may be 1 micrometer to 5.5 micrometers for electron-optics set to unity magnification (M=1×) or 10's of nanometers for greater than 100× magnification. Detector 114 may create a contrast difference image per frame (high resolution and low resolution within one overall move-acquire-measure or "MAM" cycle). Within each frame or in comparing a multiplicity of frames, algorithms can be derived to compare phase contrast differences across the semiconductor wafer thin films or the metal circuit elements of DUT 108 and similarly in the advanced semiconductor package circuit elements, whether a single layer or 3D stack of elements are being imaged and described herein to determine process variations, manufacturing tolerance variations, or critical physical defects in the integrated die and interconnection of dies, and the interconnections themselves.

Detector 114 may also be capable of determining, using imagining spectroscopy mode, the chemical or material type and quantity of a specific element within DUT 108. To achieve spectroscopy two techniques can be used: using the aforementioned EELs analysis on the photoelectrons within electron optical column 112 or photon counting may be used in conjunction with detector 114. In the latter case of photon counting, an X-ray photon of a given energy corresponding to the shadow-gram, yields a specific packet size of electrons in the CMOS, sCMOS, or CCD cameras. This property can be used to selectively map a photon received back to its energy by counting the number of electrons it can produce in a circuit. In charge counting, a packet of electrons is generated per X-ray photon or visible photon. In other words, instead of integrating pixel elements over a fixed time, a thresholding element that holds and sums only when electron packets are sufficiently large are instead counted. This mode of detection is called photon counting or charge counting on the CMOS, sCMOS or CCD camera. This packet can be processed electronically differently than by having a charge accumulation circuit that involves a transistor and a capacitor. In one embodiment, the counting circuit can be set up to sample the packet of electrons, followed by measuring against a critical threshold (e.g., is the packet sufficiently large or not), and then counted as one count if above the critical threshold value representing a single energy for the original incoming X-ray photon. Then the count may be accumulated with a counter circuit to decipher the total counts or events that arrived above this critical threshold value (number of photons arriving above the critical threshold). Multiple circuit channels can then go through a multiplexer or MUX to move the critical threshold to various values (one threshold per channel); thus the multiple channels represent energy bins from lowest to highest and each pixel becomes a multichannel energy counter and every output image is the sum of all the channels of all the elements in DUT 108 that can be down selected electronically to represent one or more elements at a time for material analysis, including a single element at a time. The latter is a manner of counting N×N pixels that exceed a critical threshold instead of charge accumulation that cannot discriminate by incoming energy at the detector 114. For example, the threshold may be set high enough to discriminate only the photons above a certain energy that have arrived at the pixel array that represent a single value of the element, removing the confusion or noise from all the rest of the materials. Various methods may be used to walk this threshold down from high energy to low energy and decipher the charge packets at specific X-ray energies within a narrow energy value. For instance, a map of pixels that arrive over a narrow range of energies can be determined by calculating a difference between two image scans at neighboring threshold values. These steps in threshold can be chosen fine or large and used to determine the delta in the original X-ray photon energy discrimination. In one embodiment, thresholds can be used to differentiate elements in a semiconductor circuit (Cu, Sn, Ag, Si), and then an image can be formed counting only X-rays emanating from absorption due to Cu, and the disparity map between like areas of Cu would find the Cu-related defects or process or assembly variations, or highly accurate gauge for physical extent or x, y, z, overlay errors. Similarly, for Sn in solder, thresholds may be set to count only the X-rays impacted by absorption of Sn (near the k-edge or L-edge of Sn), and this could be used to find disparity maps between like Sn areas and would outline defects related to only Sn variation such as extra or missing tin. This sifting in energy results in elemental or compositional specific image generation and defect inspection that is not capable today over the range of magnifications demonstrated by this art. This ultimately is imaging spectroscopy, determining elemental type and quantity of a specific element for devices under test DUT 108. Thus, in part, by defect detection system 100 converting X-rays into photoelectrons, spectroscopy with detector 114 may be achieved by linking a particular chemical element within DUT 108 to a chemical concentration, and physical distribution within the image using photon counting or conventional EELs.

Figure 2:
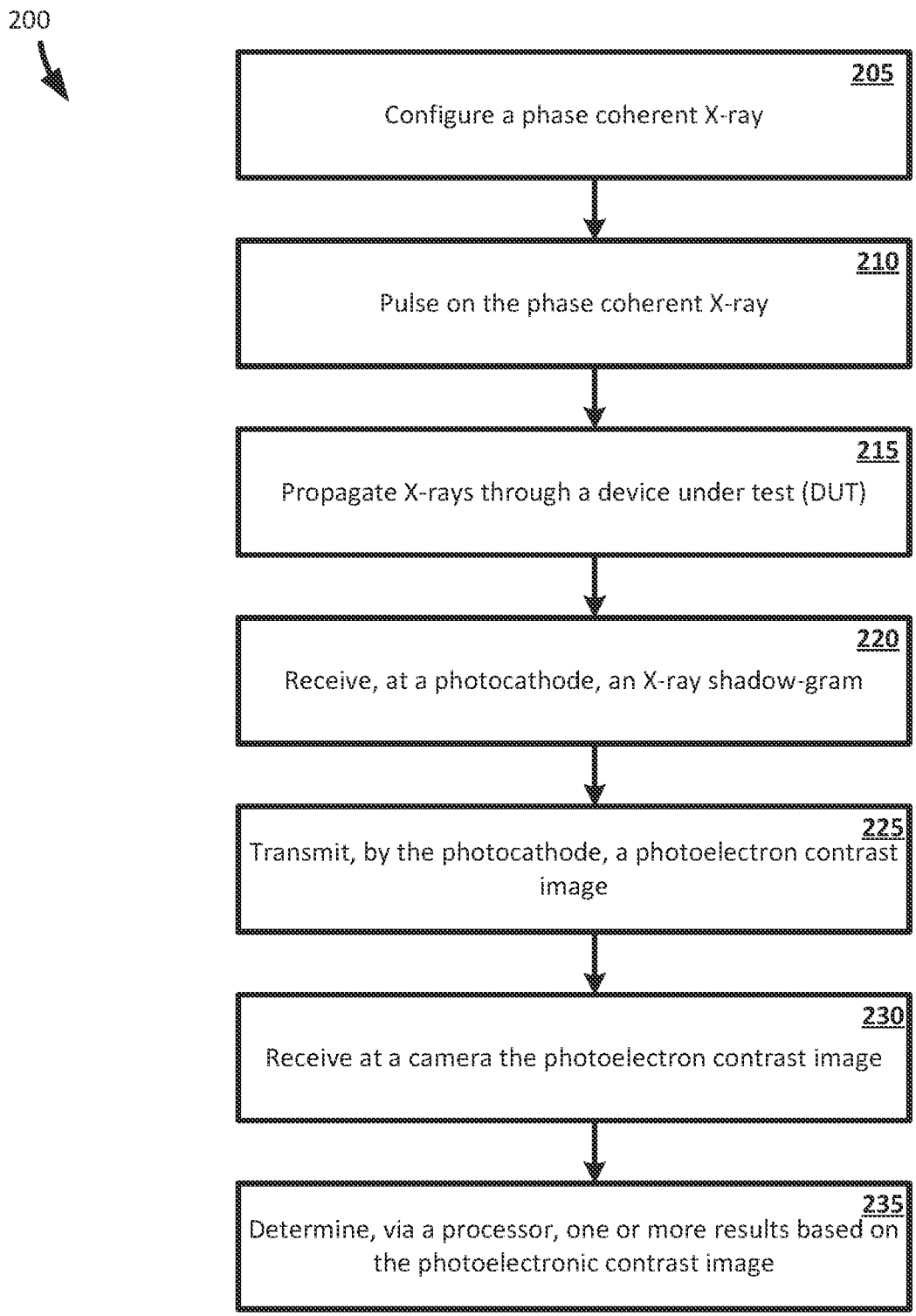
FIG. 2 illustrates a method of operation in accordance with one or more embodiments described herein.

FIG. 2 illustrates an example process 200 for performing microscopy and/or spectroscopy on a DUT. One or more processes associated with process 200 may be performed by one or more elements of defect detection system 100. At 205, a phase coherent X-ray is configured. To configure a coherent X-ray means to establish a system for generating a coherent X-ray. In one embodiment, the phase coherent X-ray is configured by a source attachment (e.g., source attachment 106) in conjunction with an incoherent X-ray source (e.g., source 104). In one embodiment, the incoherent X-ray source may be a CNT X-ray. In another embodiment, the X-ray source is phase coherent. Those skilled in the art will recognize there may be other ways to configure a phase coherent X-ray.

At 210, a controlling device selectively pulses on and off the phase coherent X-ray. In one embodiment, the controlling device may be source controller 102. The controlling device may be a device that is capable of outputting pulses at one or more frequencies comprising of different duty cycles and implementing pulse width modulation. For example, a pulse may be outputted from the controlling device that turns on the phase coherent X-ray for 20 milliseconds with a rise/fall time of 10 nanoseconds to 100 nanoseconds. In another embodiment, each pulse (or group of pulses) may correspond to a different image location of a DUT. In another embodiment, each pulse (or group of pulses) may correspond to a same image location of a DUT. In another embodiment, each pulse (or group of pulses) may correspond to a different magnification (e.g., 1× to 1000×). In another embodiment, each pulse (or group of pulses) may correspond to a same magnification (e.g., 1×).

At 215, coherent X-rays propagate through a DUT. In one embodiment, the DUT may be DUT 108. A gap, break, or crack present in the DUT will cause a phase shift in X-ray wavefront and upon subsequent physical propagation distance develop Fresnel fringe interference patterns. That is, the phase shift caused by a defect may be recognized once the X-rays that have penetrated through the DUT travel a sufficient path length (i.e., propagation interference) or a certain distance. In one embodiment, said certain distance may be between 10 millimeters but less than 1 meter. Once an X-ray penetrates through the DUT, it may create a shadow-gram (i.e., an X-ray shadow-gram) containing the Fresnel fringe interference patterns that are proportional to the second derivative of the phase shift in the wavefronts.

At 220, a photocathode receives a shadow-gram and converts the shadow-gram to a photoelectron contrast image in a nanometer resolved image, with or without interference and without loss of generality. In one embodiment, converter 110 is embodied by a photocathode. In one embodiment, converter 110 is embodied by an anisotropic multilayer photocathode. The photocathode may be designed according to one or more design elements. Such design elements may ensure that X-rays (within the shadow-gram) are stopped with high stopping power and subsequently received by the photocathode are absorbed by the photocathode. Otherwise, X-rays received by the photocathode may escape the photocathode, and physical resolution and phase coherence indications in the received shadow-gram may be lost. For example, if photocathode or anisotropic multilayer photocathode is designed to be too thick then the phase coherence in the received shadow-gram may not be accurately translated to the photoelectron contrast signal.

At 225, the photocathode transmits the photoelectron contrast image, via an electron-optical column, to a camera. The photocathode comprises of a first layer that as a very high stopping power for the received X-ray shadow. Coupled to the first layer is a second layer that is the photocathodes active layer. Together these two layers create a photoelectron contrast image. In one embodiment, the electron-optical column may be electron-optical column 112. In another embodiment, the electron-optical column may be a high vacuum system with photoelectron emission microscope PEEM optics or low energy electron microscope LEEM optics.

At 230, the camera receives the photoelectron contrast image. In one embodiment, detector 114 may be embodied by a camera. The camera may be a regular CMOS, scientific CMOS or CCD camera. In another embodiment, the camera may be utilized to perform microscopy on the DUT by producing, from the received photoelectron contrast image, one or more electronic maps within one or more frames. This electronic map may contain a grayscale image of an imaged portion of the DUT. In another embodiment, the camera may be utilized to perform spectroscopy on the DUT by utilizing photon counting or EELs analysis to determine the chemical type and quality of a specific element within an image portion of the DUT.

At 235, a processor determines one or more results based on the photoelectron contrast image. A result may be the indication of a variation in process or assembly, a gauge to track a critical dimension or offset errors, or a defect, such as a break, gap, crack, or missing element within the DUT. A result may also be the indication of a certain chemical compound or element concentration or lack thereof within the DUT. The processor may be coupled to (or be integrated into) the camera and may be utilized to perform computational functions, including but not limited to subpixel shifting of the imaging array and reconstructing super resolution images. For example, the processor may receive one or more frames of electronic maps that indicate phase shift or fringe interference pattern disturbances (which indicate one or more defects or variations in process or assembly). The processor may then output an electronic map via a display or written to a database file such as CSV, TXT, or KLARF format. The displayed electronic file or map may visually indicate x, y, and z coordinates/positions of one or more defects, or process or assembly variations called disparity maps, their physical existence or count, concentration, and the metering of the physical extent or gauge value for metrology. In one embodiment, the processor may receive between 10-150 frames per second with pixel resolutions ranging between 10 nanometers to 5.5 microns for 167× to 1× optics, respectively. In another embodiment, the processor may receive one or more frames of electronic maps and perform photon counting on the received images in order to determine the chemical makeup of one or more portions of the DUT. In such an embodiment, the processor may compare an X-ray photon (as indicated in the electronic map) to a list of elements and their corresponding packets of electrons generated per X-ray photon (or visible photon) to identify a particular element within the electronic map, which in turn would indicate that element is present in the imaged portion of the DUT, delivering both the amount or concentration and its spatial distribution or locations.

What is claimed:

1. A system comprising:
   a source controller that controls one or more cycles of a light emitting device, wherein a cycle of the one or more cycles comprises an on state and an off state, wherein
      during a first cycle of the one or more cycles, the light emitting device images a first portion of a device under test at a first magnification level;
      during a second cycle of the one or more cycles, the light emitting device images a second portion of the device under test at a second magnification level;
   a converter that, based at least in part on one or more images of the light emitting device, indicates one or more properties of the device under test;
   a detector that, based at least in part on the one or more properties of the device under test, generates at least one electronic map; and
   the detector further outputs the at least one electronic file for the electronic map.

2. The system of claim 1, wherein a cycle of the one or more cycles has a duration of less than 1 second.

3. The system of claim 1, wherein the first cycle of the one or more cycles and the second cycle of the one or more cycles are both less than 1 second.

4. The system of claim 1, wherein the converter is a photocathode comprising an electrically conductive layer with a thickness between 0.1 nanometer and 10 nanometers.

5. The system of claim 1, wherein the converter is a photocathode that has a mean transverse energy of less than 0.1 eV and the photocathode has energy spreads of less than 0.050 eV for photoelectrons.

6. The system of claim 1, wherein the detector comprises a charged coupled device (CCD) camera or a scientific complementary metal-oxide semiconductor (sCMOS) camera or a complementary metal-oxide semiconductor (CMOS) camera.

7. The system of claim 1, wherein the detector generates a photoelectron contrast image that one or more indications of attenuation or changes in phase coherence based at least in part on the light beam being incident on the device under test.

8. The system of claim 1, wherein the light beam is an X-ray comprising of spatially coherent X-rays.

9. The system of claim 1, wherein the one or more properties of the device under test comprises a crack, break, or an air gap within the device under test.

10. The system of claim 1, wherein the one or more properties of the device under test comprises solder joint defects within the device under test.

11. The system of claim 1, wherein the one or more properties of the device under test comprises a chemical makeup of one or more portions of the device under test.

12. A method comprising:
   cycling, via a source controller, a light emitting device between one or more cycles, wherein a cycle of the one or more cycles comprises an on state and an off state;

imaging, during a first cycle of the one or more cycles, a device under test at a first magnification level to produce a first image;

imaging, during a second cycle of the one or more cycles, the device under test at a second magnification level to produce a second image;

generating, via a converter, based at least in part on one or more images, an indication of at least one or more properties of the device under test;

generating, via a detector, based at least in part on the one or more properties of the device under test, at least one electronic map; and outputting the at least one electronic file for the electronic map.

13. The method of claim 11, wherein a cycle of the one or more cycles has a duration of less than 1 second.

14. The method of claim 11, wherein the first cycle of the one or more cycles and the second cycle of the one or more cycles are both less than 1 second.

15. The method of claim 11, wherein the converter is a photocathode comprising an electrically conductive layer with a thickness between 0.1 nanometer and 10 nanometers.

16. The method of claim 11, wherein the converter is a photocathode that has a mean transverse energy of less than 0.1 eV and the photocathode has energy spreads of less than 0.050 eV for photoelectrons.

17. The method of claim 11, wherein the detector comprises a charged coupled device (CCD) camera or a scientific complementary metal-oxide semiconductor (sCMOS) camera or a complementary metal-oxide semiconductor (CMOS) camera.

18. The method of claim 11, wherein the one or more images comprises one or more indications of attenuation or changes in phase coherence based at least in part on the light beam being incident on the device under test.

19. The method of claim 11, wherein the light beam is an X-ray comprising of spatially coherent X-rays.

20. The method of claim 11, wherein the one or more properties of the device under test comprises a crack, break, or an air gap within the device under test.

* * * * *